United States Patent [19]

McGarry

[11] Patent Number: 5,021,258
[45] Date of Patent: Jun. 4, 1991

[54] METHOD OF COATING FIBERS WITH METAL OR CERAMIC MATERIAL

[75] Inventor: Frederick J. McGarry, Weston, Mass.

[73] Assignee: The Dow Chemical Company, Midland, Mich.

[21] Appl. No.: 564,485

[22] Filed: Aug. 8, 1990

[51] Int. Cl.$^5$ ................................................ B05D 3/06
[52] U.S. Cl. ..................... 427/35; 427/53.1; 427/171; 427/222; 427/250; 427/255.3; 427/296
[58] Field of Search ................ 427/35, 53.1, 171, 222, 427/250, 255.3, 296

[56] References Cited

U.S. PATENT DOCUMENTS

| 4,624,751 | 11/1986 | Morin et al. | 204/28 |
| 4,759,950 | 7/1988 | Stevens | 427/55 |
| 4,788,084 | 11/1988 | Morin | 427/343 |
| 4,904,351 | 2/1990 | Morin | 204/28 |
| 4,911,797 | 3/1990 | Hoebel | 204/28 |
| 4,935,296 | 6/1990 | Stevens | 428/288 |

FOREIGN PATENT DOCUMENTS 280184 8/1988 European Pat. Off. .
335185 10/1989 European Pat. Off. .

*Primary Examiner*—Bernard D. Pianalto

[57] ABSTRACT

Ordered polymer fibers, such as aramid or polybenzazole, can be coated with a ceramic coating by physical vapor deposition to yield a coated fiber having improved properties.

14 Claims, No Drawings

METHOD OF COATING FIBERS WITH METAL OR CERAMIC MATERIAL

BACKGROUND OF THE INVENTION

The present invention relates to fibers containing oriented, crystalline or semi-crystalline polymer.

Composites contain a matrix resin that contains and is supported by a reinforcing fiber. Oriented polymer fibers are known to be useful in matrix resins. Typical oriented polymers include aramid fibers (commercially available under the trademark Kevlar TM from E. I. DuPont de Nemours & Co.); highly-oriented polyethylene fibers (commercially available under trademark Spectra TM from Allied-Signal Corp.); and polybenzazole fibers.

Each of those fibers presents several opportunities for improvement. First, the compressive strength of the fibers is typically small compared to their tensile strength and modulus. It would be desirable to improve that strength. Second, the fibers have a negative coefficient of thermal expansion in the axial direction and a positive coefficient of the thermal expansion in the radial direction. Such coefficients are suspected of causing troublesome microcracks in composites reinforced by Kevlar ® polyamide fibers, and so it is desirable to minimize their effects in polybenzazole fibers. Third, it may be desirable to modify the behavior of fibers in specific environments, such as moisture uptake in hot wet environments, oxidative stability in oxidizing environments.

SUMMARY OF THE INVENTION

One aspect of the invention is a coated fiber comprising an oriented polymer fiber and a ceramic coating adhered to the oriented polymer fiber. A second aspect of the present invention is a process for synthesizing a coated fiber comprising the step of contacting an ordered polymer fiber with a vapor of a metal or ceramic material under reduced pressure sufficient to provide a high mean free path between the source of the vapor and the ordered polymer fiber, under conditions such that physical vapor deposition occurs. A third aspect of the present invention is a composite containing a coated fiber of the present invention and a matrix material.

Fibers coated with an appropriate metal or ceramic material may have increased compressive strength and/or reduced radial thermal expansion, as compared with uncoated fibers. Other coatings may be chosen to protect against moisture uptake or oxidizing agents or to affect other properties of the fiber, such as color, dielectric constant or conductivity.

DETAILED DESCRIPTION OF THE INVENTION

The present invention begins with a fiber containing an oriented polymer. The polymer is preferably an aramid, a highly oriented polyethylene or a polybenzazole. It is more preferably an aramid or a polybenzazole and most preferably a polybenzazole.

Aramid fibers are known and commercially available. Exemplary suitable fibers are commercially available under the trademarks Kevlar TM, Twaron TM and Techora TM. The polymers in the fibers preferably contain primarily p-phenylene moieties linked by amide groups. Certain preferred polymers contain a mixture of m- and p-phenylene moieties linked by amide groups, but the most preferred polymers contain essentially no m-phenylene moieties. Aramid fibers are discussed in greater detail in 3 Kirk-Othmer Ency. Chem. Tech. (3rd Ed., *Aramid Fibers*, 213 (J. Wiley & Sons 1978).

Oriented polyethylene fibers are also known and commercially available. Exemplary suitable fiber is commercially available under the trademark Spectra TM.

Polybenzazole polymers and processes to make fibers from them are also known. Polybenzazole polymers contain a plurality of mer units that comprise:

(1) an aromatic group (Ar); and
(2) a first azole ring fused with the aromatic group; and preferably further comprise:
(3) a second azole ring fused with the first aromatic group; and
(4) a divalent organic moiety (DM) that does not interfere with the synthesis fabrication or use of the fiber bonded to the 2-carbon of the second azole ring.

Polybenzazole mer units are preferably represented by one of Formulae 1(*a*) or (*b*), and more preferably by Formula 1(*b*):

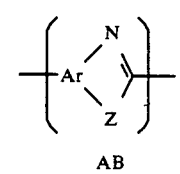

AB     1(a)

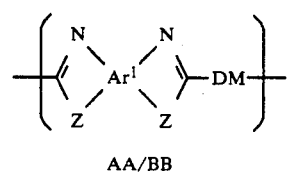

AA/BB     1(b)

wherein each Ar represents an aromatic group; each Z represents -O-, -S- or -NR-, wherein each R is a hydrogen atom, a lower alkyl group or a phenylene moiety; and each DM represents a divalent organic moiety as previously defined.

Each aromatic group (Ar) is preferably a carbocyclic group containing no more than about 12 carbon atoms, and more preferably either a 1,3,4-phenylene moiety in the case of AB-polybenzazole (AB-PBZ; Formula 1(*a*)) or a 1,2,4,5-phenylene moiety in the case of AA/BB-polybenzazole (AA/BB-PBZ: Formula 1(*b*)). Each azole ring is preferably an oxazole or a thiazole ring (-Z-=-O- or -S-) and more preferably an oxazole ring (-Z-=-O-). Each DM is preferably an aromatic group and more preferably a 1,4-phenylene moiety. The preceding moieties are preferably chosen such that resulting polymer is at a rigid rod polymer or a semi-rigid polymer and are more preferably chosen such that the resulting polymer is a rigid rod polymer. Examples of highly preferred mer units are represented by Formulae 2(*a*)–(*e*):

2

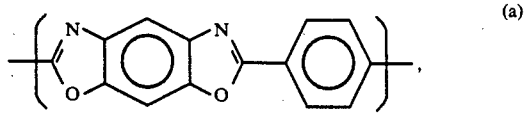

(a)

-continued

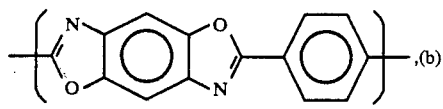,(b)

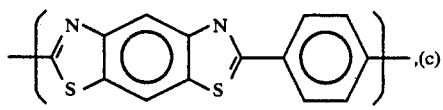,(c)

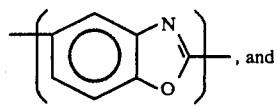, and

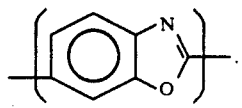.

The polybenzazole polymer may be a polybenzazole "homopolymer," consisting essentially of a single repeated of mer unit as described in U.S. Pat. No. 4,533,693 at columns 9 to 45; or may be a random or block "copolymer" such as those described in U.S. Pat. No. 4,533,693 at columns 45-81 and in Harris et al., Copolymers Containing Polybenzoxazole, Polybenzothiazole and Polybenzimidazole Moieties, International Application No. PCT/US89/04464 (filed Oct. 6, 1989), International Publication No. WO 90/03995 (published Apr. 19, 1990), which are incorporated herein by reference. The polymer is preferably a "homopolymer." It more preferably forms a liquid crystalline solution when dissolved at a suitable concentration in a solvent acid, such as polyphosphoric acid and/or methanesulfonic acid, and/or coagulates from solvent acid to form a crystalline or semicrystalline coagulated fiber.

The polymer preferably should have sufficient molecular weight to form a spinnable dope solution. Its molecular weight is preferably at least about 10,000; more preferably at least about 20,000; and most preferably at least about 50,000. For poly-(para-phenylene-cis-benzobis-oxazole) (cis-PBO) the intrinsic viscosity of the polymer in methanesulfonic acid at 25° C. and about 0.05 g/dL concentration is preferably at least 10 dL/g, more preferably at least about 20 dL/g and most preferably at least about 30 dL/g. It is preferably no more than about 50 dL/g.

The polymers may be synthesized by reaction of suitable monomers in dehydrating acid solutions, such as polyphosphoric acid and/or a mixture of methanesulfonic acid and $P_2O_5$, with vigorous agitation under nitrogen atmosphere. Reaction temperatures are typically between 75° C. and 220° C., and are usually increased in a step-wise manner. The resulting dope is then spun and drawn into a suitable coagulant bath by ordinary dry-jet wet-spinning techniques to form fibers. Synthesis of suitable polybenzazole polymer and fiber spinning are described in numerous references, such as in U.S. Pat. Nos. 4,263,245; 4,533,693 and 4,776,678; in PCT International Publication No. WO 90/03995 (published Apr. 19, 1990); and in Ledbetter et al., "An Integrated Laboratory Process for Preparing Rigid Rod Fibers from the Monomers," *The Materials Science & Engineering of Rigid Rod Polymers* 253 (Materials Research Society 1989), which are each incorporated herein by reference.

The spun fiber may be exposed to brief high temperature under tension ("heat treatment" or "heat setting") to improve tensile strength and/or modulus, such as is described in U.S. Pat. No. 4,544,119, which is incorporated herein by reference. Heat treatment may be for any period of time from a few seconds to about 30 minutes, and at a temperature between 300° C. and 700° C., inclusive. Of course, longer residence time is ordinarily desirable at lower temperatures and shorter residence time at higher temperatures.

The desirable properties of the resulting fiber are highly dependent upon the polymer and the spinning conditions. For cis-PBO, the tensile strength is preferably at least about 400 kpsi (2.9 GPa) and more preferably at least about 550 kpsi (3.9 GPa). For Cis-PBO, the tensile modulus preferably at least about 30,000 kpsi (207 GPa) and more preferably at least about 42,000 kpsi (289 GPa). The compressive strength is preferably as high as possible, but is frequently as low as 25 kpsi (0.17 GPa).

The fibers are coated with a metal or ceramic material by physical vapor deposition technique. Physical vapor deposition is well-known in the art of electronic circuitry and is described in numerous references, such as Thornton, "Physical Vapor Deposition," *Semiconductor Materials* 329-445 (Noges Publ. 1988), which is incorporated herein by reference. In physical vapor deposition, the fiber is placed in a vacuum. A target of the metal or ceramic material to be coated on the fiber is vaporized, for instance by an electron beam or a laser beam. The resulting vapor coats the fiber. The process is continued until a coating of the desired thickness is obtained.

The fiber may be coated with a metal or ceramic material capable of undergoing physical vapor deposition. The metal or ceramic material should be chosen based upon the properties desired in the resulting coated fiber. For instance, if a coated fiber of increased compressive strength and/or modulus is desired, then the coating material preferably has higher compressive properties than the polymer in the oriented polymer fiber. Other coatings may be chosen to increase hardness, increase adhesion to a matrix, protect the fiber from contact with outside chemicals, add an electrically conductive surface or reduce the coefficient of thermal expansion.

Metals suitable for coating may be, for instance, titanium, tungsten, aluminum, nickel, Monel TM, steel, copper and molybdenum. Ceramics suitable for coating may be, for instance, silicon and oxides, carbides and borides of silicon and/or metals such as those previously described. The coating is preferably a ceramic, is more preferably an aluminum containing ceramic and is most preferably aluminum oxide ($Al_2O_3$).

The chamber for deposition should be sufficiently evacuated to provide a high mean free path between the source of the metal or ceramic vapor and the fiber(s) to be coated. It preferably provides essentially collision-free "line-of-sight" transportation to the oriented polymer fiber(s). The pressure in the chamber is preferably less than about $10^{-4}$ Torr, more preferably no more than $10^{-5}$ Torr, more highly preferably no more than $10^{-6}$ Torr and most preferably no more than $10^{-7}$ Torr.

The target is evaporated by known techniques, such as using inductive heating, electron-beams or lasers.

The target is preferably heated by electron beam or laser and more preferably by electron beam. Such techniques are discussed in Thornton, "Physical Vapor Deposition," supra at 336-355, which is incorporated herein by reference. The target is preferably a solid block, as opposed to being powdered, when heating is commenced.

The fiber should be mounted so that the fiber receives an even coating. The coating is typically deposited on the fiber in a "line-of-sight" manner, so that the coating is very uneven unless the fiber is surrounded by several vapor sources and/or is rotated throughout the deposition process to present the entire surface more or less evenly to the target.

The fiber should have a relatively clean surface to promote adhesion of the coating to the fiber. It is ordinarily easier to get good adhesion to polybenzazole than to get good adhesion to aramid. It is theorized that the adhesion of coatings to aramid is due to the presence of water and/or processing residues on and/or in the fiber. Aramid fibers may contain processing residues that reduce adhesion but can often be removed by washing with a solvent such as water. Furthermore, aramid fibers have a large number of hydrogen bonding sites which may attract and hold moisture. Such moisture can be removed in a dessicator oven at at least about 100° C.

The deposition is continued until the fiber receives a coating of the desired thickness. This thickness may vary depending upon the material being deposited and the intended use of the fiber. For most purposes, the coating thickness is, on average, preferably at least about 200Å, more preferably at least about 500Å, and most preferably at least about 1000Å. The maximum thickness is limited primarily by practical consideration. It is, on average, preferably no more than about 10,000Å and more preferably no more than about 8000Å.

Depending upon the coating, the coated fiber may offer one or more advantage over uncoated fibers. If the metal or ceramic material has a high compressive strength, such as $Al_2O_3$, then the compressive strength of the fiber may be 100-200 percent higher than the compressive strength of the uncoated fiber. The coating provides stiffening for the oriented polymer in the fiber.

Other improvements in fiber properties are also possible. The fiber may have a substantially reduced radial coefficient of thermal expansion. A coating of abrasion resistant material, such as diamond, may reduce self-abrasion of the fiber. A conductive coating, such as gold, can provide a conductive fiber. An oxygen resistant coating may improve the oxidative stability of the coated fibers. An adhesive coating may provide better adhesion between the fiber and a matrix resin. A coating may be selected to provide more than one of those benefits.

The coated fiber may be used in composites, as described in 6 Kirk-Othmer Ency. Chem. Tech. (3rd Ed.), *Composite Materials*, 683 (J. Wiley & Sons 1979); Kirk-Othmer Ency. Chem Tech Supplement 3rd Ed.), *Composites, High Performance*, 260 (J. Wiley & Sons 1984); and 14 Ency. Poly. Sci. & Eng., *Polybenzothiazoles and Polybenzoxazoles*, 601 (J. Wiley & Sons 1988), which are incorporated herein by reference. They may also be used in ropes and cables, circuit boards, and other applications for which fibers are desirable.

ILLUSTRATIVE EXAMPLES

The following Examples are for illustrative purposes only, and are not to be taken as limiting either the Specification or the claims. Unless otherwise indicated, all parts and percentages are by weight.

EXAMPLE 1

Coating of PBO and Aramid Fiber

Six-inch long samples of polybenzoxazole and/or aramid fibers are mounted on a rack such that each sample of fiber may be fractionally or fully rotated during physical vapor deposition. The rack holds 10 to 20 samples per run. The rack is placed in a vacuum chamber about 18 inches from a graphite crucible containing a target consisting of a solid block of aluminum oxide ($Al_2O_3$). The crucible is set so that there is an unobstructed path from the target to each of the fibers. An electron beam source is positioned such that it can irradiate and vaporize portions of the target.

The chamber is pumped down to a pressure of about $10^{-7}$ torr. The target is irradiated with an electron beam to vaporize portions of the target. In some cases, the fibers are mechanically rotated continuously during the deposition process. In other cases, the deposition process is halted periodically, each fiber is turned one quarter turn to present a different surface to the target, and deposition is continued. The process of coating, turning and coating is repeated three times until the entire fiber surface is coated.

Deposition is continued for time periods ranging from 2 to 8 minutes until each fiber is coated with aluminum oxide to a thickness between about 2500Å and about 7500Å.

EXAMPLE 2

Tensile and Compressive Property Measurement

A sample of polybenzoxazole fiber is tested for axial compressive strength by the fiber recoil method, as described in Allen, "Tensile Recoil Measurement of Compressive Strength for Polymeric High Performance Fibers," 22 J. Material Sci. 853 (1987), and has an average compressive strength of about 23 kpsi (0.16 GPa). Samples of the fiber are coated with $Al_2O_3$ to varying average thicknesses, as described in Example 1 above, using continuous rotation during the deposition process. The measurement of compressive strength is repeated, and the thickness of coating is measured by measuring the average thickness of coating on a glass slide placed on the rack next to the fibers during the deposition process. Those measurements are shown in Table 1.

TABLE 1

| Coated PBO Compressive Strength | |
| --- | --- |
| Coating Thickness (Å) | Axial Comp. Str. kpsi (GPa) |
| 2618 | 36 (0.25) |
| 3268 | 41 (0.28) |
| 3357 | 37 (0.26) |
| 3965 | 53 (0.37) |
| 6772 | 63 (0.43) |

The same process is repeated using aramid fibers sold under the trademark Kevlar ™ 49 by E. I. DuPont de Nemours & Co. The aramid fiber is heated under vacuum for 1 hour at 100° C. prior to coating. The uncoated fiber has an average compressive strength of about 45 kpsi (0.31 GPa). The coated fibers have the average compressive strength shown in Table 2.

TABLE 2

| Coated Aramid Compressive Strength | |
|---|---|
| Coating Thickness (Å) | Axial Comp. Str. kpsi (GPa) |
| 3287 | 64 (0.44) |
| 3448 | 46 (0.32) |
| 4577 | 50 (0.34) |
| 5887 | 50 (0.34) |
| 6269 | 50 (0.34) |
| 6881 | 65 (0.45) |
| 8474 | 45 (0.31) |

EXAMPLE 3

Reduced Coefficient of Thermal Expansion

Fibers of PBO which are uncoated and fibers coated an average of 4000Å of $Al_2O_3$, as described in Example 1, are tested for radial thermal expansion. The fibers exhibit the coefficient shown in Table 3.

TABLE 3

| PBO Thermal Expansion Coefficients | |
|---|---|
| Coating Thickness (Å) | Radial CTE (ppm/°C.) |
| none | 91 |
| 4000 | 49 |
| 4000 | 40 |

What is claimed is:

1. A process for synthesizing a coated fiber comprising the step of contacting an ordered polymer fiber with a vapor of a metal or ceramic material under reduced pressure sufficient to provide a high mean free path between the source of the vapor and the ordered polymer fiber, under conditions such that physical vapor deposition occurs.

2. The process of claim 1 wherein the ordered polymer fiber contains an aramid polymer.

3. The process of claim 1 wherein the ordered polymer fiber contains a polybenzazole polymer.

4. The process of claim 1 wherein the ordered polymer fiber contains an oriented polyethylene polymer.

5. The process of claim 1 wherein the process is carried out under a pressure such that there is an essentially collision-free "line of sight" between the ordered polymer fiber and a source of the vapor.

6. A process for synthesizing a coated fiber comprising the step of contacting an ordered polymer fiber with a vapor of a metal or ceramic material under a pressure of no more than about $10^{-4}$ torr, under conditions such that physical vapor deposition occurs.

7. The process of claim 6 wherein the process is carried out under a pressure of no more than about $10^{-7}$ torr.

8. The process of claim 6 wherein the vapor is produced by heating a metal or ceramic target using a laser or an electron beam.

9. The process of claim 8 wherein the target contains titanium, tungsten, aluminum, nickel, monel, steel, copper or aluminum.

10. The process of claim 8 wherein the target contains silicon.

11. The process of claim 8 wherein the target contains an oxide, carbide or boride of silicon or a metal.

12. The process of claim 8 wherein the process is continued until the coating on the fiber has an average thickness of at least about 200Å.

13. The process of claim 8 wherein the process is continued until the coating on the fiber has an average thickness of at least about 500Å.

14. The process of claim 8 wherein the process is continued until the coating on the fiber has an average thickness of between about 1000Å and 10,000Å.

* * * * *